United States Patent
Wu et al.

[11] Patent Number: 5,923,596
[45] Date of Patent: Jul. 13, 1999

[54] PRECHARGE-ENABLE SELF BOOSTING WORD LINE DRIVER FOR AN EMBEDDED DRAM

[75] Inventors: John Wu, Ottawa; Lidong Chen, Nepean; Peter B. Gillingham, Kanata, all of Canada

[73] Assignee: Mosaid Technologies Incorporated, Kanata, Canada

[21] Appl. No.: 09/074,413

[22] Filed: May 8, 1998

Related U.S. Application Data

[62] Division of application No. 08/773,770, Dec. 24, 1996, Pat. No. 5,835,438.

[51] Int. Cl.[6] .................................................. G11C 7/00
[52] U.S. Cl. ............................... 365/189.09; 365/189.11; 365/204; 365/193
[58] Field of Search ........................... 365/226, 230.06, 365/189.09, 189.11, 204, 193; 327/534, 536, 537

[56] References Cited

U.S. PATENT DOCUMENTS

| | | | |
|---|---|---|---|
| 5,255,224 | 10/1993 | Galbi et al. | 365/189.09 |
| 5,297,104 | 3/1994 | Nakashima | 365/230.06 |
| 5,694,355 | 12/1997 | Skjaveland et al. | 365/149 |
| 5,835,438 | 11/1998 | Wu et al. | 365/230.06 |

*Primary Examiner*—Viet Q. Nguyen
*Attorney, Agent, or Firm*—Pascal & Associates

[57] ABSTRACT

A method of driving a DRAM word line comprising initiating a word line active cycle from a leading edge of a row enable signal, applying a first voltage to a word line following and as a result of said leading edge, receiving a trailing edge of the enable signal and applying a boosted voltage to the word line following and as a result of the trailing edge.

14 Claims, 4 Drawing Sheets

PRECHARGE-ENABLE SELF BOOSTING WORD LINE DRIVER FOR AN EMBEDDED DRAM

This application is a division of U.S. application Ser. No. 08/773,770 filed Dec. 24, 1996, now U.S. Pat. No. 5,835,438.

FIELD OF THE INVENTION

This invention relates to Dynamic Random Access (DRAM) word line drivers, and more particularly to word line drivers found in embedded DRAMs of Application Specific Integrated Circuits (ASIC).

BACKGROUND TO THE INVENTION

A standard DRAM utilizes a charge storage cell for storing a data bit, which cell is comprised of a cell access field effect transistor (FET) which has its gate connected to a word line and its drain connected to a bit line. A capacitor, created using field effect technology, is connected between the source of the FET and a cell plate voltage source or $V_{cp}$.

In applications involving DRAMs embedded in ASICs, since the integrated circuit substrate is connected to ground, the memory cell array is implemented using p-channel capacitors and access devices. The array is therefore contained in an n-well which is biased to a positive voltage to prevent latchup. In such a PMOS array, the DRAM word line, which is held at $V_{DD}$ in the off state, must be brought to a negative voltage which is more negative than $V_{SS}$ in the active state in order to fully turn on the cell access FET, and to allow a full $V_{SS}$ voltage level to be stored by the cell.

However, the negative voltage cannot be generated in CMOS circuits employing both NMOS and PMOS devices since the p-substrate is connected to $V_{ss}$. A negative voltage cannot be connected to any n-channel source or drain because it would forward bias to the substrate. P-channel dynamic circuits must therefore be used to generate the negative voltage used by the word line driver.

A structure for generating the negative voltage using all p-channel FETs is described in the specification of U.S. patent application entitled "Memory Cell And Wordline Driver For Embedded Dram in ASIC Process", Ser. No. 08/355,956 filed Dec. 14, 1994, invented by Karl Skjaveland et al. The structure from that application, over which the present invention is an improvement, is reproduced in FIGS. 1A and 1B herein, using reference numerals similar to those in the aforenoted patent application.

FIG. 1A illustrates a word line voltage generating circuit from the aforenoted patent application that uses only p-channel FETs.

The top plate (gate) of a p-channel FET capacitor 30 is connected to the X+ node which is an input to the circuit of FIG. 1B. A CMOS inverter 45 has its output connected to the bottom plate (source-drain) of capacitor 30. The source-drain circuit of p-channel FET 36 is connected between the input of capacitor 30 and the gate 34 of p-channel FET 34. The gate of FET 36 is connected to ground. The drain of FET 34 is connected to the node X+.

Also connected to the node X+ is the drain of p-channel FET 28, the source of which is connected to voltage source $V_{DD}$.

The gate of FET 28, the input to inverter 45 and the source of FET 34 are each driven by respective inverters 47, 48 and 49.

The input to the circuit for receiving an Xi signal, a secondary row address signal generated at the beginning of an active cycle, is connected through a pair of serially connected inverters 50, the output of which is connected both to the input of inverter 49 and to the input of serially connected inverters 51, as well as to an input of NOR gate 53. The other input to NOR gate 53 is connected to the Xi node. The output of the pair of inverters 51 is connected to an input of NAND gate 55 which has its output connected to the input of inverter 48. The other input to gates 53 and 55 are connected to the input for receiving signal Xi.

FIG. 1B illustrates a word line driving circuit, and FIG. 1C is a timing chart from the aforenoted patent application. Voltage X+ is applied via the source-drain circuit of an FET 23 to the word line 3. The word line is selectively connected to VDD via the source-drain circuit of an FET 24. A wordline address signal *j is decoded from word line address circuitry, and the predecoder generate signal PDXG are combined by a NAND gate whose output is applied to the gate of FET 23 via the source-drain circuit of FET 25. A word line reset voltage PUB derived from the address signal is applied to the gate of FET 24 via inverter 40. Ground is applied to the gate of FET 25.

Prior to a cycle, the address signal related input to inverter 40 is high, causing conduction of FET 24. Node Xg is high causing FET 23 to be non-conductive. The word line 3 is thus held at about VDD voltage level during standby.

At the start of a row cycle, both the decoded address signal Xj and PDXG go high, the input to inverter 40 goes low, PUB node goes high, and FET 24 becomes non-conductive.

At approximately this time the word line signal X+ then becomes boosted to a voltage negatively greater than ground ($V_{SS}$) as will be described below. Now assuming that the ratio of gate oxide capacitance to stray capacitance plus FET 25 drain capacitance is high, node Xg will track the X+ voltage, due to capacitive coupling in FET 23, i.e. it will perform self-boosting. This will allow FET 23 to pass the boosted voltage X+ to the word line 3.

During standby, the secondary row decoder signal Xi in the voltage generator circuit (FIG. 1A) is low. This maintains node RB low and thus precharges X+ to VDD through FET 28. Nodes DR and CSD− are high and low respectively. At the beginning of the active cycle, Xi goes high. As a result, the following sequence of events occur: node RB goes high, thus turning off FET 28. DR goes high while CSD− is still low. This allows FET 34 to first set the X+ voltage to $V_{SS}$.

Shortly thereafter, as a result of the propagation delay through inverters 51 and NAND gate 55 and inverter 48, CSD− goes high, switching off FET 36. Furthermore, CSD (the output of inverter 45) now goes from high to low, and since it is connected to one side of the boost capacitor 30, boosts the X+ line negatively. Once this has occurred, this negatively boosted voltage is passed on to the word line driver and on to the word line itself via FET 23 (FIG. 1B).

It should be noted however, that once the X+ line is boosted negatively at the beginning of the active cycle, it has no path to accept any positive charge; in other words, X+ will remain boosted negatively until the end of the active cycle. This extended negative voltage can damage the capacitor integrity of devices in ASIC processes which are not designed to withstand negative voltages for long periods of time.

SUMMARY OF THE INVENTION

The present invention provides a control of the time at which the boosted voltage interval begins, and the period during which the boosted voltage is maintained. Further, in an embodiment of the invention these times can be programmed. The result is the ability to apply the boosted voltage only when needed, which can be for a minimal period of time and during a late portion of a row active cycle, thus allowing danger to the integrity of the oxide to be minimized.

In accordance with an embodiment of the invention, a method of driving a DRAM word line is comprised of the steps of initiating a word line active cycle from a leading edge of a row enable signal, applying a first voltage to a word line following and as a result of the leading edge, receiving a trailing edge of the enable signal and applying a boosted voltage to the word line following and as a result of said trailing edge. Preferably the boosted voltage is applied during a late portion of the active cycle.

Another embodiment of the invention is the apparatus on which the above method can be implemented.

In accordance with yet another embodiment of the invention, a voltage boost circuit is comprised of a p-channel FET capacitor having a gate forming a top plate and source and drain forming a bottom plate, an output node for providing a boosted output voltage connected to the top plate, a first p-channel FET having its source connected to a voltage source VDD and its drain connected to the top plate, a second p-channel FET having its drain connected to the top plate and a third p-channel FET having its drain connected to a gate of the second FET and its gate connected to ground (Vss), and an inverter having its output connected to the bottom plate of the capacitor and its input to the source of the third FET. A first logic level of an RB signal derived from presence of a first logic level of a row enable signal is applied to a gate of the first FET to cause it to conduct and thus raise the output node to VDD and to charge the top plate to VDD. An opposite logic level of said RB signal is applied to the gate of the first FET and a first delayed signal DR derived from appearance of the second logic level of the row enable signal is applied to the source of the second FET to cause the second FET to pass onto the top plate and output node the voltage $V_{ss}$. A third signal CSD− derived from appearance of the second logic level of the row enable signal is applied to the source of the third FET to cause it to cease to conduct, thus causing the second FET to cease conduction. The CSD− signal is applied through the inverter to the bottom plate of the capacitor whereby the voltage at the top plate of the capacitor is lowered below $V_{ss}$ to a negatively boosted voltage $-V_{boost}$.

It is preferred that the first logic level appears at a rising edge of a row enable signal, and the second logic level appears at a following dropping edge of the row enable signal.

BRIEF INTRODUCTION TO THE DRAWINGS

A better understanding of the invention will be obtained by considering the detailed description below, with reference to the following drawings, in which.

DETAILED DESCRIPTION OF THE INVENTION

Figure 1A:
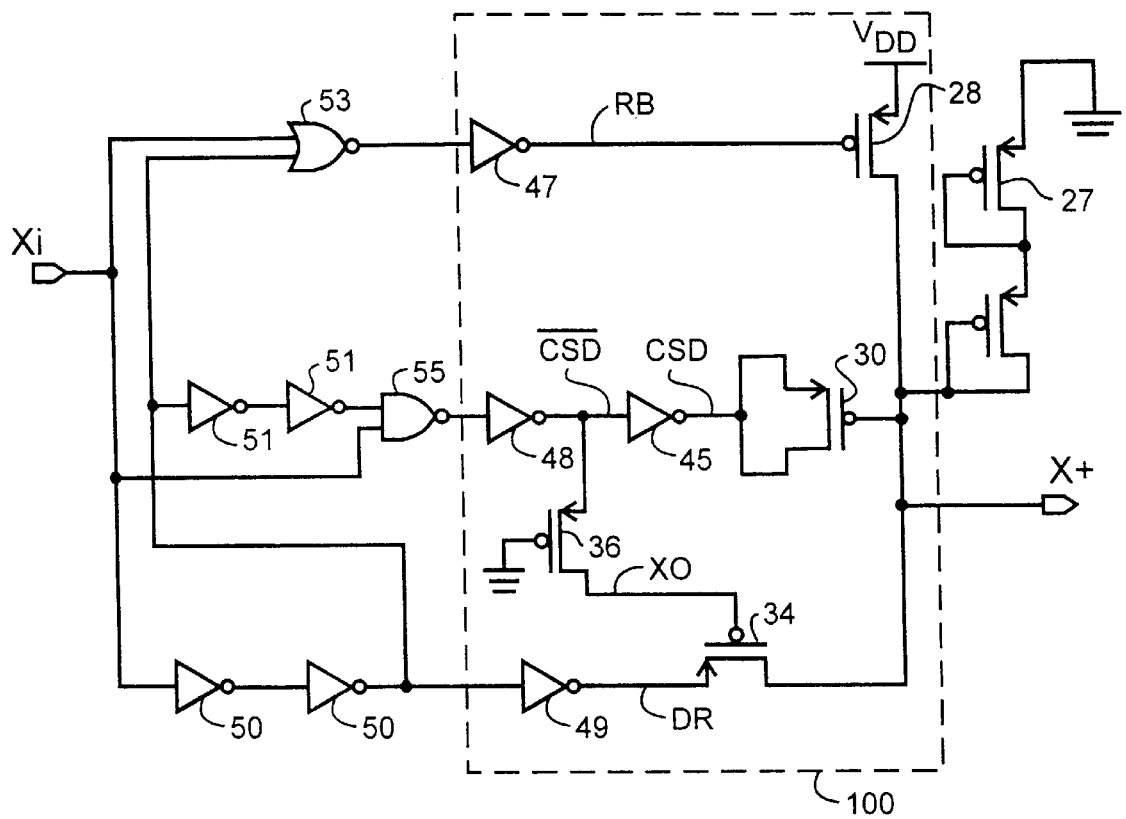
FIG. 1A is a prior art circuit of a word line voltage booster circuit.
Figure 1B:
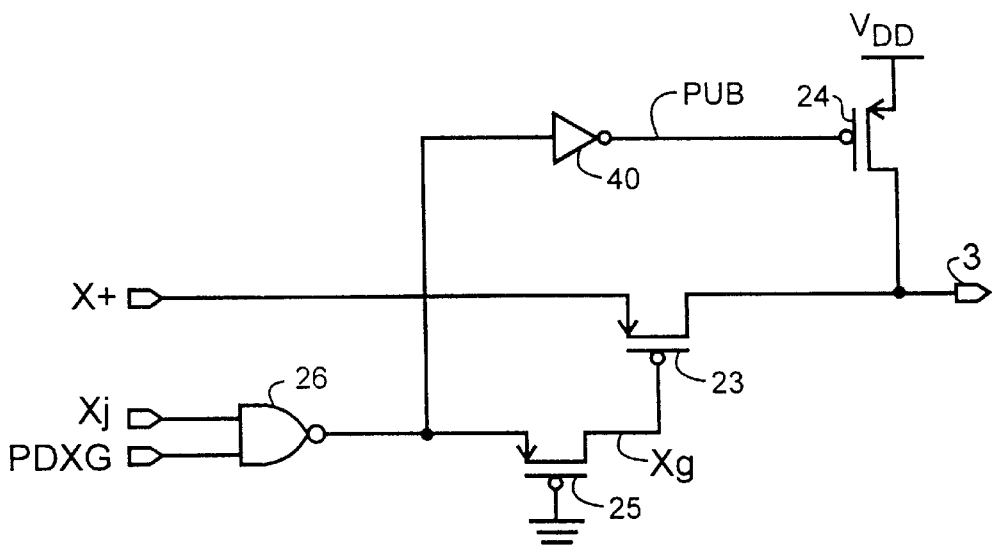
FIG. 1B is a prior art circuit of a word line driver.
Figure 1C:
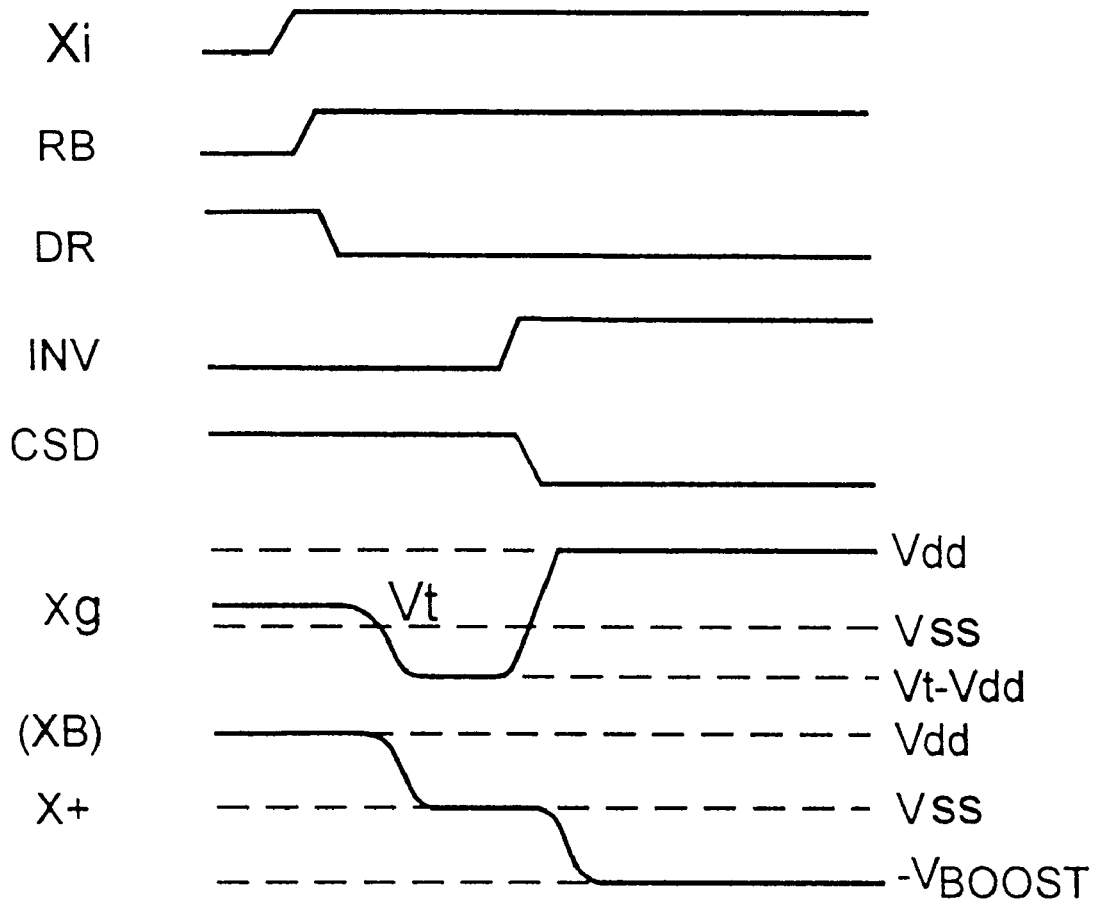
FIG. 1C is a timing chart of signals in the circuits of FIGS. 1A and 1B.
Figure 2:
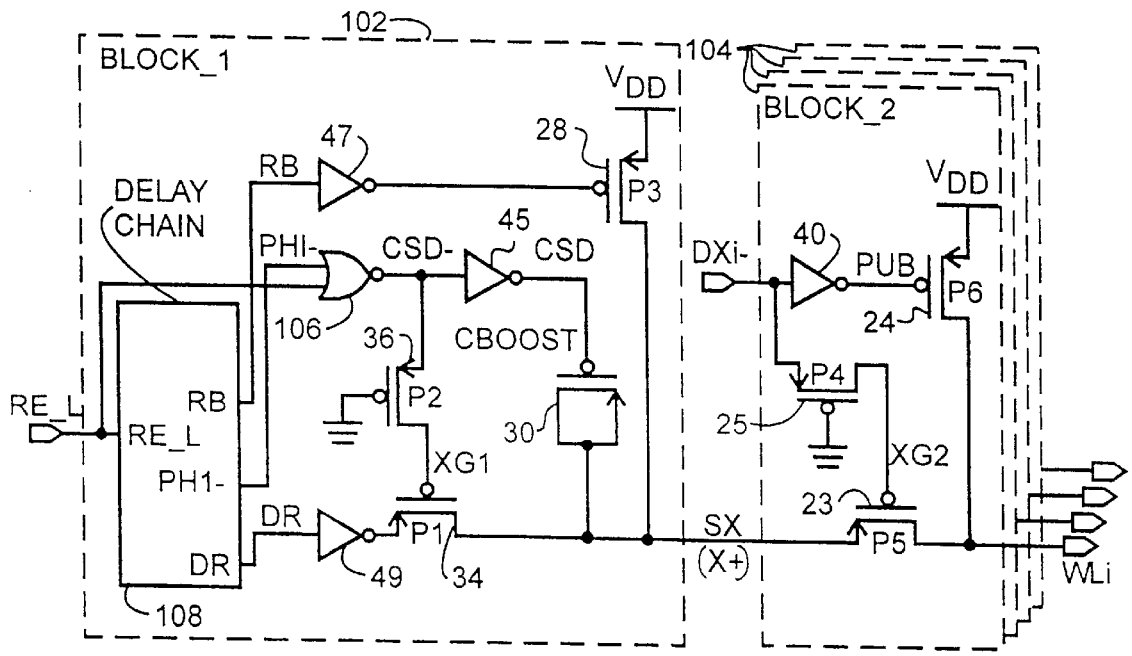
FIG. 2 is a schematic diagram of a word line voltage booster circuit and word line driver, according to the present invention.
Figure 3:
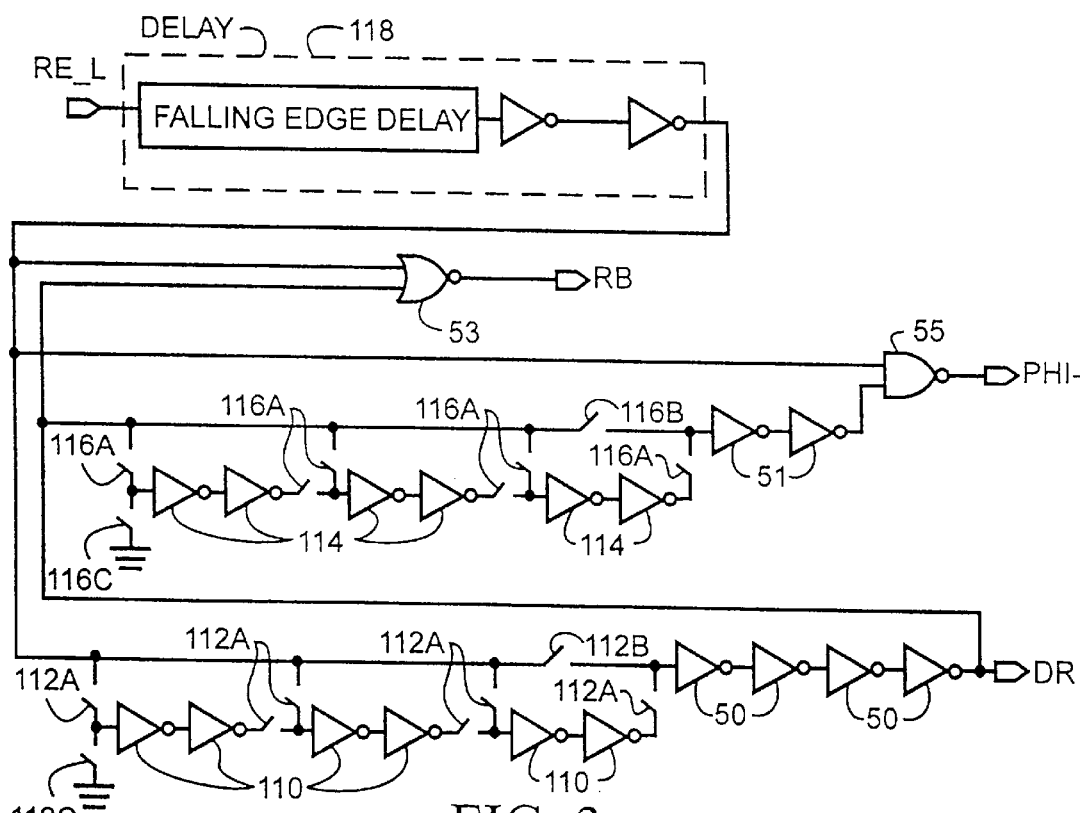
FIG. 3 is a schematic diagram of a delay circuit used in the embodiment of FIG. 2.

Turning now to FIGS. 2 and 3, the elements within the dashed line box 100 of FIG. 1A are retained and are similarly referenced block 1 within the dashed line box 102 in FIG. 2. In addition, the elements from FIG. 1B that are reproduced in each of the dashed line boxes 104 of FIG. 2 have corresponding reference numerals.

In place of inverter 48 of the prior art circuit of FIG. 1A, a NOR gate 106 is used in FIG. 2, and is shown connected to the node PHI− output of delay chain circuit 108 in FIG. 2.

A preferred embodiment of delay chain 108 is illustrated in FIG. 3. NAND gate 55 is connected to the PHI− node of NOR gate 106 instead of being connected to inverter 48 as in the prior art circuit of FIG. 1A. The inputs to inverters 47 and 49, labeled RB and DR respectively, are connected to delay chain 108, as well as node PHI−.

The circuit shown in FIG. 3 is comprised of sequences of inverters 110 and bypass switches 112A, 112B and 112C. The inverters 110 can be switched in series with a series of inverters 50 when switches 112A are switched closed in combination around groups of inverters 110, when switch 112B is open. Similarly the circuit is comprised of sequences of inverters 114 and bypass switches 116A, 116B and 116C. Inverters 114 can be switched in series with inverters 51 when switches 116A are switched closed in combination around groups of inverters 114, when switch 116B is open. The input to a first group of inverters 110 can be connected to ground through switch 112C and the input to a first group of inverters 114 can be connected to ground through switch 116C so as to lock parts of the circuit to low logic level e.g. for test purposes. The switches are preferably programmable, such as by an external logic circuit the structure of which does not form part of the present invention.

The output of inverters 50 is node DR, and forms the input to inverter 49 in FIG. 2. Node DR is also connected to the input to inverters 51 through switch 116B and to the input of inverters 114 through switch 116A, and is also connected to an input to NOR gate 53. The output of NAND gate 55 is node PHI−, and the output of NOR gate 53 is node RB, which is connected to an input of inverter 47 in FIG. 2. The PHI− node is connected to the aforenoted input to NOR gate 106 in FIG. 2.

The input signal RE__L optionally passes through a delay circuit 118 and is applied to a second input of NOR gate 53, a second input of NAND gate 55 and to the input to the delay circuit formed of inverters 110 and associated switches 112A, 112B and 112C. In addition, the delayed RE__L signal is applied to the second input of NOR gate 106 in FIG. 2.

In FIG. 2, input signal DXi− to inverter 40 and FET 25 is a decoded word line address signal corresponding to the output of the NAND gate combining Xj and PDXG signal of FIG. 1B, having a falling edge following the delayed row enable signal rising edge, as will be seen from the description below. The output node SX of block 102, which represents the same node as X+ in FIGS. 1A and 1B, can drive a number of word line drivers 104, which can in turn, drive word lines WLi, depending on the load of WLi and the capacitance of CBOOST capacitor 30.

Figure 4:
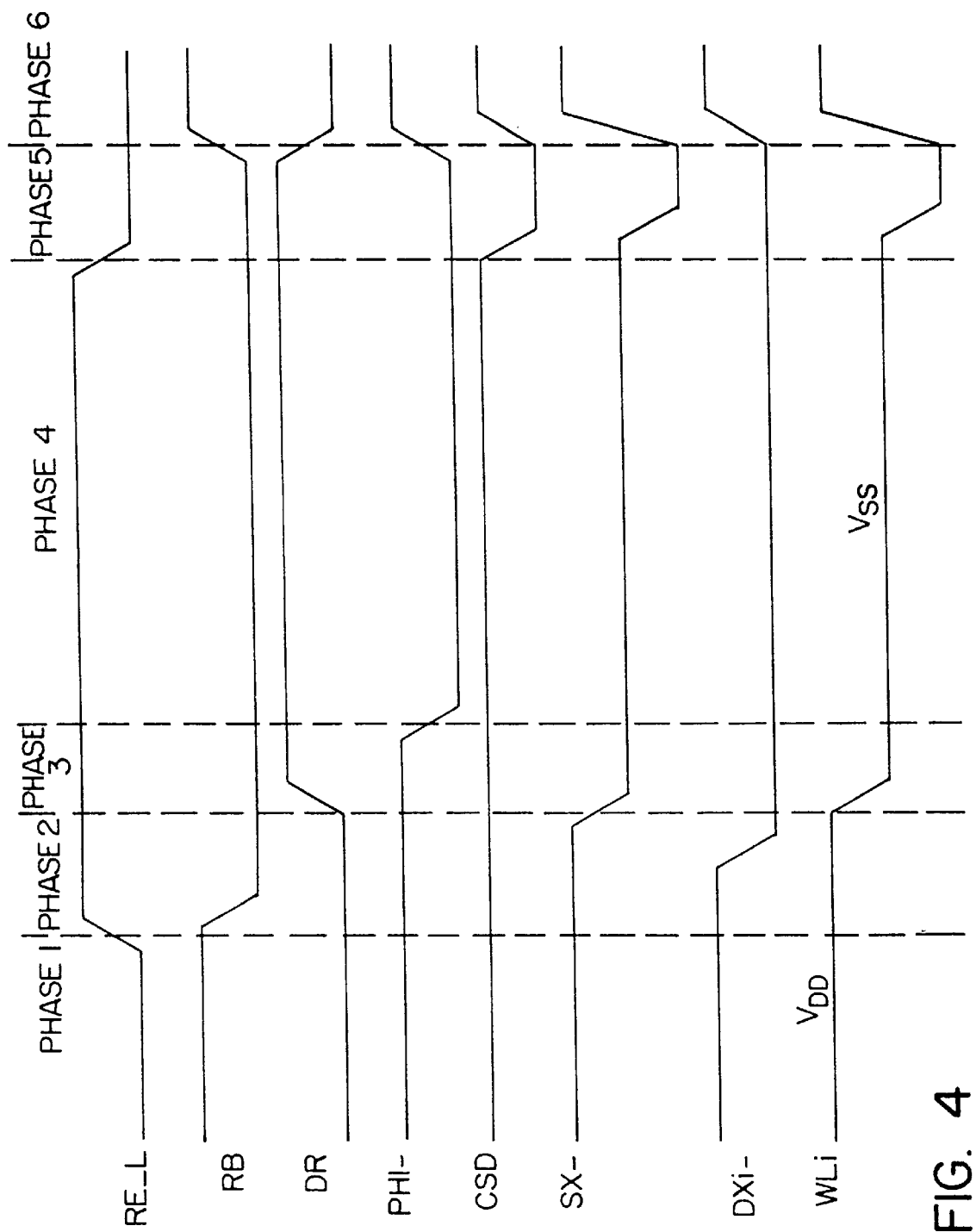
FIG. 4 is a timing chart of signals in the circuits of FIGS. 2 and 3.

In operation, with reference also to the timing diagram of FIG. 4, the three signals appearing on and labeled the same as the aforenoted nodes, RB, DR and PHI– are generated from the RE_L signal, in the circuit of FIG. 3. These signals are responsible for controlling the different timing phases for the self-bootstrapping function, as will be described later.

Upon initiating an active row cycle, after the signal RE_L goes high, the RB signal is the first to fall. DR rises after a programmable delay created by the series of inverters 50 and 110. This delay provides time for the settling of the gates of FETs 34 and 23, which are labeled as nodes XG1 and XG2 respectively.

A programmable delay also follows the rise of DR to the fall of PHI–, caused by the series of inverters 51 and 114 passing the DR signal which is applied to their input. This delay allows the signal on the SX (X+) node to settle close to $V_{ss}$ prior to the voltage boosting interval.

It has been found that during the active cycle, $V_{ss}$ is sufficient to apply to the word line for a reading of the cell since the bit lines are precharged to $V_{pp}/2$. This was an important discovery since the prior art does not do this during the active cycle. Instead, the prior art provides the boosted negative voltage throughout the active cycle, hence subjecting the oxides to higher stress for a longer period of time.

To initiate the beginning of the precharge cycle, shown in FIG. 4 as Phase 5, the input RE_L signal goes to low logic level. RE_L is delayed by the falling edge delay circuit to then produce the RB and PHI– signals. The RE_L signal going low defines the beginning of the voltage boost interval during which the word line is to be boosted below $V_{ss}$, while the duration of the falling edge delay defines the interval during which the actual boosting occurs. Note that the boost effectively occurs at the end of the active cycle. The actual precharge operation does not commence until the boosting interval has expired.

With reference to FIG. 1B, during Standby, the secondary row decoder signal (Xj) and row predecoder generate signal (XG) are both low, hence causing conduction of FET 24 and precharging word line 3 to $V_{pp}$. At the onset of an Active Cycle, the Xj and PDXG signals for the selected block both go high, thus switching FET 24 off through inverter 40, and also enabling transistor 23 to pass the boosted X+ voltage.

The timing diagram shown in FIG. 4 is divided into phases to better understand operation of the circuit.

Phase 1

The RB signal, driven from the RE_L signal following delay through delay circuit 118 and NOR gate 53, begins at high logic level. The delayed RE_L signal also passes through the delay circuit which includes inverters 110 and 50, resulting in the DR signal being at low logic level. The DR signal being low causes FETs 34 and 28 to conduct, causing the SX node to be pulled to VDD. Assuming the circuit has not been addressed by DXi–, FET 23 conducts and the word line WLi is thus at VDD. The signal CSD– at the input to inverter 45 is low, resulting in the signal at CSD, the bottom plate of capacitor 30 being high.

Phase 2

The RE_L signal then goes high. Following the short delay in NOR gate 53, the RB signal driven by the RE_L signal becomes low, causing FET 28 to cease conduction. However node SX is still kept at VDD by FET 34 being conductive. The address signal DXi– goes low, causing XG2 to be brought to $V_{tp}$ (its threshold of conduction voltage) via FET 25. XG1 is also held at Vtp via FET 36. As a result, both FETs 34 and 23 are on. CSD is still high. FET 24 is driven off from the inverted DXi voltage being high.

Phase 3

DR is driven high after the delay of the RE_L signal through inverters 110 and 50 causing node SX to be pulled to $V_{ss}$ through FET 34. Through self-bootstrapping the parasitic capacitive coupling between the gate and source/drain of FETs 34 and 23 couples the falling voltage on the SX node into the nodes XG1 and XG2 so that they fall below $V_{ss}$ and maintain FETs 23 and 34 conductive. The voltage on word line WLi follows the voltage on SX to $V_{ss}$, and turns on the memory cell transistor for data access. The speed of the voltage on word line WLi going to voltage $V_{SS}$ is determined by the load of the word line and the sizes of FETs 34 and 23. During this phase, the voltage CSD is still high.

Phase 4

The signal PHI– goes low, after the delay of the DR signal passing through inverters 114 and 51. This signal can be used to generate sense amplifier control signals.

Since the signal RE_L is still high, node CSD– is still high and all the remaining nodes are kept at the same states as in Phase 3. The voltage on WLi remains at Vss, and will do so until the falling edge of RE_L appears at the beginning of Phase 5.

Phase 5

The falling edge of RE_L appears, indicating that a precharge cycle should begin. The signal CSD– rises due to coupling of the RE_L signal from the output of delay circuit 118 through NAND gate 106. Node XG1 is pulled high, and FET 34 ceases conduction as a result. The voltage CSD falls, and the boost capacitor 30 couples the transition to the SX node, to boost it below $V_{ss}$ as described earlier with regard to the prior art circuit. The voltage on node XG2 is low due to the low level of the addressing signal DXi–.

The transition of node SX from $V_{ss}$ to a voltage below $V_{ss}$ is also coupled by the parasitic capacitance between the gate and the source/drain of FET 23 to bootstrap the word line WLi below $V_{ss}$ (typically to $V_{ss}-V_{tp}$) to restore full logic "0" level.

Phase 6

The signals RB and PHI– go to high logic level thus defining the end of a short period during which $-V_{boost}$ is applied to the wordlines and the signal DR goes to low logic level, all due to the delayed falling edge of the signal RE_L. The SX node is pulled to high logic level through FET 28. The address signal DXi– goes high, FET 23 becomes nonconductive and the word line WLi is pulled to high logic level through FET 24.

The falling edge delay thus determines the time interval of phase 5, i.e. the voltage boost interval.

In summary, the input signal RE_L, a latched row enable signal, is applied to an input of the circuit shown in FIG. 3. The rising edge of the latched row enable signal is used to activate a row cycle, and the falling edge is used to activate a precharge cycle. The falling edge of the RE_L signal is used as a control for the beginning of the boost interval, and programmable delay circuits are used to control the interval of the boost.

With the precharge cycle activated from the falling edge of the row enable signal, the boosted voltage interval is separated from the row cycle activation signal and can be separately controlled as to timing, thus achieving the ability to minimize electric field damage to the integrated circuit oxide caused by the boosted voltage.

The circuits of the present invention thus perform a self-boosting operation to restore data to a memory cell for a short duration at the end of the active cycle, effectively delaying the precharge portion of the active cycle from starting. The duration of the boost interval is determined by a falling edge detector implemented in a row cycle delay chain and activated by a signal requesting the beginning of the precharge cycle.

The duration of the boosting operation and the resulting negative voltage which is applied to the selected devices is greatly reduced over the prior art, thus resulting in higher oxide integrity.

It should be noted that as in the prior art circuit, no n-channel FETs need be used for any of the negatively boosted nodes.

However, the invention could be implemented by NMOS technology. For example, in a triple well process having NMOS access FETs and NMOS cell capacitors, the present invention would use a positive boosted voltage instead of a negative voltage.

While the delay circuits have been shown as sequences of inverters, any form of delay elements suitable for this circuit can be used instead.

The invention can be used in embedded DRAM integrated circuits or conventional DRAM integrated circuits.

A person understanding this invention may now conceive of alternative structures and embodiments or variations of the above. All those which fall within the scope of the claims appended hereto are considered to be part of the present invention.

We claim:

1. A voltage boost circuit comprising a p-channel FET capacitor having a gate forming a top plate and source and drain forming a bottom plate, an output node for providing a boosted output voltage connected to the top plate, a first p-channel FET having its source connected to a voltage source VDD and its drain connected to the top plate, a second p-channel FET having its drain connected to the top plate and a third p-channel FET having its drain connected to a gate of the second FET and its gate connected to ground (Vss), an inverter having its output connected to the bottom plate of the capacitor and its input to the source of the third FET, means for applying a first logic level of an RB signal derived from presence of a first logic level of a row enable signal to a gate of the first FET to cause it to conduct and thus raise the output node to VDD and to charge the top plate to VDD, means for applying an opposite logic level of said RB signal derived from a second logic level of the row enable signal to the gate of the first FET and for applying a first delayed signal DR derived from appearance of the second logic level of the row enable signal to the source of the second FET and to cause the second FET to pass onto said top plate and output node the voltage $V_{ss}$, means for applying a third signal CSD– derived from appearance of the second logic level of said row enable signal to the source of the third FET to cause it to conduct thus causing the second FET to cease conduction, means for applying said CSD– signal through the inverter to the bottom plate of the capacitor whereby the voltage at the top plate of the capacitor is lowered below $V_{ss}$ to a negatively boosted voltage $-V_{boost}$.

2. A circuit as defined in claim 1 in which the high logic level of the CSD signal is derived from a second delayed signal being at low logic level and the row enable signal being at low logic level, thus defining a period during which $-V_{boost}$ is applied to the wordline.

3. A circuit as defined in claim 1 in which the first logic level of the RB signal is logic high, the first logic level of the row enable signal is logic low, the second logic level of RB is logic low and the second logic level of the row enable signal is logic high.

4. A circuit as defined in claim 3 including means for bringing the RB signal back to the first logic level as a result of and following a delay from the falling edge of the row enable signal and for applying the RB signal to the gate of the first FET to cause it to conduct and thus raise the output node to VDD, thereby ending an interval during which the output node is negatively boosted to $-V_{boost}$.

5. A circuit as defined in claim 4 including means for terminating an interval of said DR signal and an interval of said CSD– signal, each said interval delayed from said falling edge of the row enable signal.

6. A circuit as defined in claim 5 in which said second edge of the row enable signal and a trailing edge of the DR signal are substantially simultaneous.

7. A circuit as defined in claim 6 including addressable means for coupling the $-V_{boost}$ signal to at least one word line.

8. A circuit as defined in claim 7 including means for maintaining a plurality of unaddressed word lines at a voltage VDD.

9. A circuit as defined in claim 5 including programmable delay circuits for receiving said row enable signal and for providing said delayed RB, DR and CSD– signals.

10. A circuit as defined in claim 9 in which said programmable delay circuits are comprised of series circuits of inverters having programmable conductive switch bypass circuits.

11. A circuit as defined in claim 1 in which $-V_{boost}$ is applied to the wordline via a wordline driver.

12. A circuit as defined in claim 1 whereby a beginning of the period during which $-V_{boost}$ is applied to the wordlines is defined by the high logic level of the CSD– signal which in turn is derived from the combined presence of the row enable signal and a second delayed signal PHI– both being at low logic level, and whereby the end of said period is defined by the transition of both the RB and PHI– signals from low logic level to high logic level, both said transitions occurring as a result of a falling edge delay derived from the falling edge of the row enable signal.

13. A voltage boost circuit as defined in claim 1 in which the means for applying said CSD– signal to the bottom plate of the capacitor includes means for controlling the timing and interval of said voltage $-V_{boost}$ by a second logic level of the row enable signal and a second delayed signal PHI– which is later than the first delayed signal DR.

14. A voltage boost circuit as defined in claim 13 including means for deriving a PHI– signal from said DR signal.

* * * * *